United States Patent
Spiegelman et al.

(10) Patent No.: US 6,408,849 B1
(45) Date of Patent: Jun. 25, 2002

(54) RECOVERY AND PURIFICATION OF GASES USED IN MEDICAL PROCESSES

(75) Inventors: Jeffrey J. Spiegelman, La Jolla; Daniel Alvarez, Jr., San Diego; Peter K. Shogren, San Diego; Joshua T. Cook, San Diego, all of CA (US)

(73) Assignee: Aeronex, Inc., San Diego, CA (US)

( * ) Notice: Subject to any disclaimer, the term of this patent is extended or adjusted under 35 U.S.C. 154(b) by 0 days.

(21) Appl. No.: 09/336,060

(22) Filed: Jun. 18, 1999

(51) Int. Cl.[7] ............................ A62B 23/02; A62B 7/10
(52) U.S. Cl. ........................ 128/205.27; 128/205.12; 128/205.28; 128/898
(58) Field of Search .................. 128/205.28, 205.27, 128/205.12, 898, 920, DIG. 27, 200 RY; 95/98, 101–105, 117

(56) References Cited

U.S. PATENT DOCUMENTS

| | | | | |
|---|---|---|---|---|
| 3,674,022 A | * | 7/1972 | Dounoucos | 128/205.12 |
| 5,542,966 A | * | 8/1996 | D'Amico et al. | 95/101 |
| 5,545,396 A | * | 8/1996 | Albert et al. | 424/93 |
| 5,632,803 A | * | 5/1997 | Stoner et al. | 95/53 |
| 5,642,625 A | * | 7/1997 | Cates, Jr. et al. | 62/55.5 |
| 5,707,425 A | * | 1/1998 | D'Amico et al. | 95/101 |
| 5,785,953 A | * | 7/1998 | Albert et al. | 424/93 |
| 5,789,921 A | * | 8/1998 | Albert et al. | 324/300 |
| 5,803,064 A | * | 9/1998 | Phelps et al. | 128/203.12 |
| 5,809,801 A | * | 9/1998 | Cates, Jr. et al. | 62/637 |
| 5,860,295 A | * | 1/1999 | Cates, Jr. et al. | 62/637 |
| 5,934,103 A | * | 8/1999 | Ryan et al. | 62/637 |
| 6,059,859 A | * | 5/2000 | Alvarez, Jr. et al. | 95/117 |
| 6,089,282 A | * | 7/2000 | Spiegelman et al. | 141/8 |
| 6,125,654 A | * | 10/2000 | Honig | 62/637 |
| 6,134,913 A | * | 10/2000 | Gentile | 62/637 |

FOREIGN PATENT DOCUMENTS

| | | | | |
|---|---|---|---|---|
| WO | WO 00/78398 | * | 12/2000 | 55/257.1 |
| WO | WO 00/78432 | * | 12/2000 | 128/205.12 |

OTHER PUBLICATIONS

Albert and Balamore, *Physics Res. A* [Nucl. Instr. And Meth.], "Development of hyperpolarized noble gas MRI," 402:441–453 (1998).

Beardsley, "Seeing the Breath of Life," *Scientific American*, 280(6):33–34 (Jun. 1999).

* cited by examiner

*Primary Examiner*—John G. Weiss
*Assistant Examiner*—Joseph F. Weiss, Jr.
(74) *Attorney, Agent, or Firm*—Brown Martin Haller & McClain

(57) ABSTRACT

A method is disclosed for providing a pure gas for use medical procedures in which the gas is contaminated with other gases during the procedure, and then separating the contaminants and recovering and reusing the decontaminated gas. The method is most advantageously used in medical imaging processes, such as magnetic resonance image (MRI), where hyperpolarized image enhancing noble gases, notably $He^3$ or $Xe^{129}$, are used for image enhancement in brain and lung imaging, and in which the contaminants are normally the exhalant gases from the imaged patient. The contaminated gas is passed through a series of drying and purification steps to remove the exhalant gases and separate the gas. The purified gas is then recovered and stored for reuse. This system prevents the loss of significant amounts of the image enhancing gases, which is important since key gases such as $He^3$ and $Xe^{129}$ are rare and expensive, and (especially $He^3$) permanently lost once vented. Recovery of medical process gases such as those including isotopes of carbon, fluorine or phosphorus is also contemplated. High quality MR images of lung structures and processes and of brain functions can be obtained using the purified gases from this process.

42 Claims, 1 Drawing Sheet

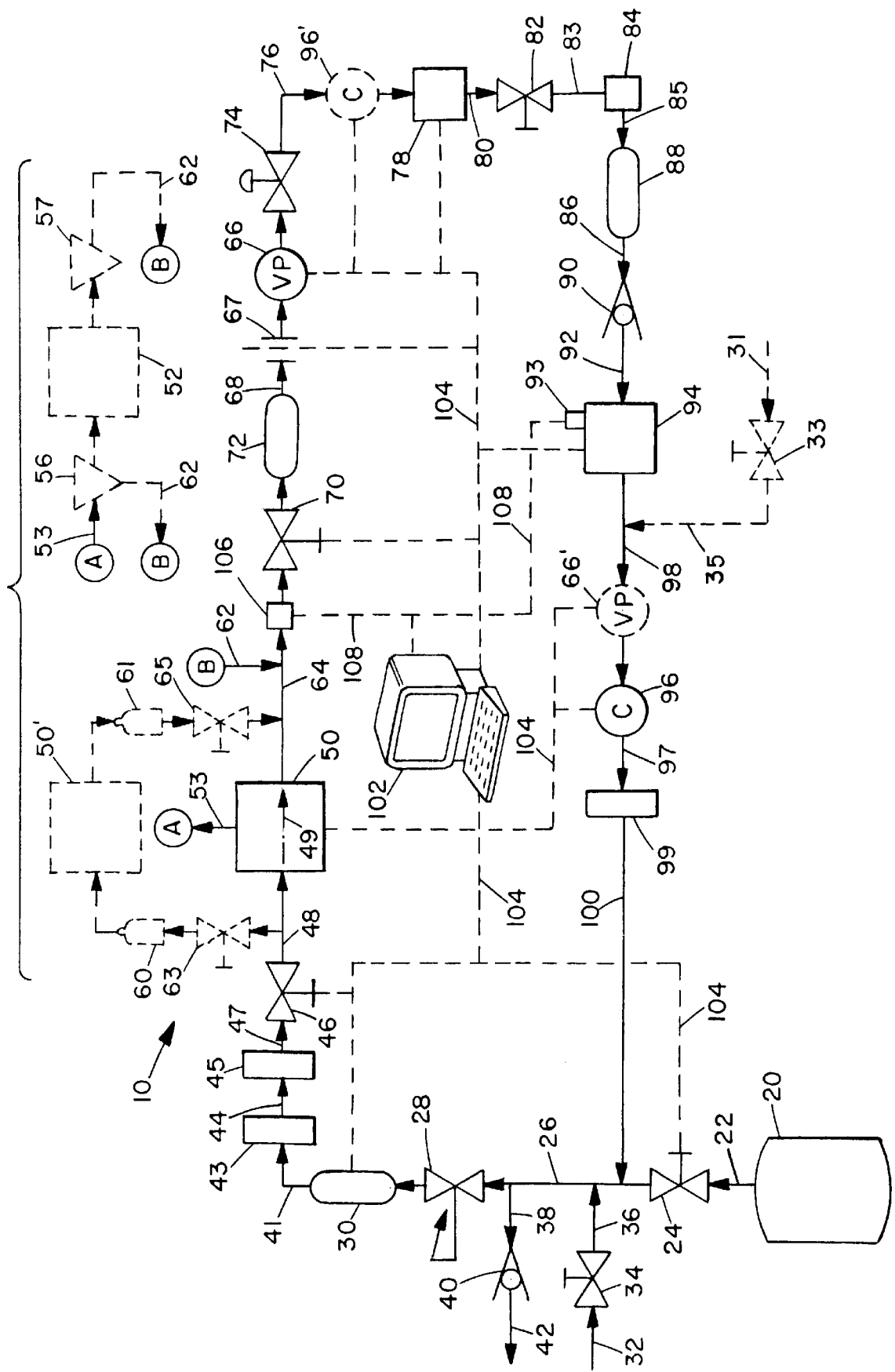

US 6,408,849 B1

RECOVERY AND PURIFICATION OF GASES USED IN MEDICAL PROCESSES

BACKGROUND OF THE INVENTION

1. Field of the Invention

The invention herein relates to the use of gases in medical processes, such as magnetic resonance imaging (MRI). More particularly it relates to the recovery and purification of such gases for reuse.

2. Description of the Prior Art

Various techniques of medical imaging have been developed in the last few years, which provide to physicians the ability to make visual images of patients' internal organs and bodily processes. Such imaging processes have been invaluable for making diagnoses of illnesses and dysfunctions and in giving surgeons the ability to locate and identify internal lesions and tumors before subjecting patients to surgery. Among the techniques widely used is magnetic resonance imaging (MRI).

MRI has been widely used for imaging the brain, heart, kidneys, and spine, since these organs produce relatively strong magnetic resonance (MR) images so that usable images can be obtained. However, other organs, notably the lungs, have not in the past produced such useful MRI images, since magnetic resonance is lower in these organs, particularly in the lungs which are of course hollow and filled with air.

A new technique, called "hyperpolarized noble gas MRI", has been developed and is reported in Albert and Balamore, *Physics Res. A* [Nucl. Instr. and Meth.], 402:441–453 (1998). The technique involves using the magnetic resonance signal from hyperpolarized noble gases $Xe^{129}$ and $He^3$ to image the lungs or brains of patients who inhaled one of these gases. Images of sufficient quality to study pulmonary disease and to assist in research to elucidate the link between the structure of the lungs and their function have been obtained. The researchers have found that $He^3$ is easier to hyperpolarize than $Xe^{129}$ and yields a stronger MR signal. On the other hand $Xe^{129}$ is dissolved much more easily in blood and can pass the blood brain barrier. Consequently it seems likely that $He^3$ will find greater use in MR imaging of lungs while $Xe^{129}$ imaging will be used more for imaging of reach structures of the brain and studies of cortical brain function.

Many details of the enhanced MR imaging with $He^3$, as well as details of hyperpolarization, have been recently described in Beardsley, "Seeing the Breath of Life," *Scientific American*, 280(6):33–34 (June, 1999).

While $Xe^{129}$ constitutes approximately one-fourth of all Xe isotopes, xenon itself is a relatively rare element, being found as only about 40 ppb in air, with $Xe^{129}$ thus being present as approximately 10 ppb in air. $He^3$ is even more rare, being present as only slightly more than 1 ppm of all helium. Loss of either of these isotopes during or after an MRI procedure therefore is a very serious matter, not only because of the initial cost of the isotope but also, especially in the case of $He^3$, because the vented material can never be recovered. Because there is so little of these materials in the world—some estimates are that the maximum world amount of $He^3$ is less than 200 kg—enhanced MR imaging using hyperpolarized $He^3$ or $Xe^{129}$ is unlikely to become widely used unless there are methods for recovery and recycling of major portions, and preferably substantially all, of these isotopes from their use in MRI procedures.

Other gases, such as hydrocarbon or fluorocarbon gases which contain $C^{13}$ or $F^{19}$ isotopes, or those using the isotope $P^{31}$, also find use in various medical processes, which processes may or may not include imaging or hyperpolarization steps. These types of gases also require recovery, usually to avoid environmental air contamination, and when recovered may be advantageously purified and recycled for reuse.

SUMMARY OF THE INVENTION

We have now invented a method for providing a pure gas for use in medical procedures in which the gas is contaminated with other gases during the procedure, and then separating the contaminants and recovering and reusing the decontaminated gas. The method is most advantageously used in medical imaging processes, such as magnetic resonance image (MRI), where hyperpolarized image enhancing noble gases, notably $He^3$ or $Xe^{129}$, are used for image enhancement in brain and lung imaging, and in which the contaminants are normally the exhalant gases from the imaging patient who inhales and exhales the gas as part of the imaging procedure.

(For brevity herein the method will be described in the context of an MRI process and hyperpolarization of $He^3$ for use therein. It will be understood that this is exemplary only, and that the method is also applicable to provision of pure gases for other medical processes or procedures, and for use with other recoverable gases. It will also be understood that such gases need not be hyperpolarized as part of the particular medical process or procedure.)

The method is a closed loop system in which the feed image enhancing gas provision is either from a storage tank of recycled, purified gas or from makeup fresh gas. The feed gas passes through a preliminary purification unit in which any contaminants which have gotten into the feed gas from tankage or transport are removed. The gas (e.g., $He^3$) is then passed to a hyperpolarization unit in which is subjected to conventional hyperpolarization, as by high energy laser beam. The hyperpolarized gas is discharged from the hyperpolarization unit into a container, such as a gas tight bag, in which it is transported to the location where the imaging procedure is to be conducted. Using as an example an MRI procedure, the patient will inhale gas from the bag and the patient will then hold his or her breath for the short time that it takes for an MRI scan of the patient's lungs to occur. After the scan is completed, the patient will exhale into another larger bag, usually several times to clear as much of the image enhancing gas as reasonably possible from the lungs. After the final exhalation by the patient, the bag of now-contaminated gas will be passed to the recovery and purification system of this invention, along with the original bag containing uninhaled gas, which will have some lesser degree of contamination from having been opened and having had the patient inhale from it. It is anticipated that a major portion of the feed gas will be returned, excepting only those portions of the gas which the patient has failed to exhale, which have been absorbed by the patient's body, or which have leaked into the ambient atmosphere during the time that either bag was opened for the patient to indicate or exhale. When the bags of contaminated gas are received by the recovery and purification system, the contaminated gas is removed from each bag and passed through a series of drying and purification steps to remove the exhalant or other contaminant gases and separate the residual image enhancing gas.

The feed gas from storage or fresh makeup to the hyperpolarization unit is normally under elevated/superatmospheric pressure, although it is discharged from the hyperpolarization unit at essentially atmospheric pressure so that it can be inhaled and exhaled by the patient with minimal loss to the ambient atmosphere. After the contaminated gas is returned to the system, it is moved onward through the system at vacuum/subatmospheric pressure by means of a vacuum pump. Depending on the type of decontamination units used to remove the exhalant gases, the contaminated gas may be compressed to superatmospheric pressure before being passed through the decontamination units, it may be passed through the decontamination units at subatmospheric pressure with pressurizing compression occurring only on the quantity purified image enhancing gas after decontamination, or compression may take place at some point intermediate in the passage through the various decontamination units. Regardless of which of these options is used, the purified gas ultimately will be returned to gas storage under superatmospheric pressure so that it can be recycled and reused for subsequent image imaging procedures.

Exhalant gases (including liquid vapors) which are removed from the contaminated gas after return from the imaging procedure usually will include oxygen, water vapor, nitrogen, carbon dioxide, argon and perhaps small amounts of other gases such as hydrogen, hydrocarbons and air pollutant gases such as nitrogen oxides or ozone that the patient has breathed from his or her normal environment or which may have entered the gas sample by handling of its container or from components within the system. It is most important to remove substantially all of the oxygen, carbon dioxide and water vapor before reuse or recycle of the image enhancing gas, because both of these gases will poison the hyperpolarization unit. While it is also important to remove the other exhalant gases, the degree of removal is less important because they will dilute the image enhancing gas. However, since they are inert with respect to hyperpolarization, they do not poison the unit but merely the imaging less efficient because the image enhancing gas in the patient's lungs after inhalation is less concentrated and therefore the resultant image is of lower quality.

It is important in this invention that all gas transport, compression and storage equipment must be designed and maintained so that it is non-contaminating to the image enhancing gas, so that (with the exception of expected contaminants, usually the exhalant gases and vapors from a patient or the airborne materials which may enter when a gas bag is opened for a patient's inhalation), other gases, vapors, particulates or foreign matter, whether organic or inorganic, do not come into contact with the gas. It is also preferred that conventional equipment, such as pumps and compressors, which include components which include volatile materials, such as lubricants and sealants, into contact with the gas, not be used. Components such as lubricants, sealants and the like emit minute quantities of unsterile volatile materials, which even though emitted only slowly, soon build up to significant quantities in the gas flow stream and render the image enhancing gas unsafe and unusable, unless expensive and additional decontamination capability is added to the process of the invention. In the present invention, therefore, it is preferred to use sterile equipment, i.e. equipment which does not place any unsterile volatile or transferable gas, liquid or particulate matter in contact with the process gas stream. Such equipment is readily available, either as completely non-contaminating equipment (i.e., without any volatile lubricants, etc.) or as food-contract grade equipment. Use of such equipment in the process permits medical imaging processes to use recovered and recycled gases without deterioration of the MR enhancing properties of the gases or of the images which they are being used to obtain, and, most importantly manufacture, without risk to the imaged patient.

While the present application is described with respect to $He^3$ and $Xe^{129}$, which are currently being used in research and imaging, it is believed that the present invention is applicable to purification of all gases used in medical procedures, especially those isotopic image enhancing gases, whether or not hyperpolarized, since the method of the present invention is not dependent upon the nature of the isotopic gas in its separation of from contaminants such as patient exhalations. Consequently other gaseous isotopes which are known to be useful in medical imaging procedures, as well as those whose utility may be determined in the future, are intended to be included. It is also intended to include all environmentally hazardous gases, such as hydrocarbons or fluorocarbons which incorporate $C^{13}$ or $F^{19}$ isotopes or phosphorus gases having the isotope $P^{31}$, as well as those gaseous isotopes of sufficient scarcity that recovery is considered economically desirable.

In a broad embodiment, therefore, the invention herein is of a method for recovery and purification of a gas used to enhance a medical process, which comprises passing said gas to said medical process imaging and therein using said gas for enhancement of said process, use in said process also causing gaseous or liquid contaminants including water vapor, carbon dioxide, oxygen or nitrogen, to become incorporated into said gas; collecting at least a portion of thus-contaminated gas; decontaminating said contaminated gas of contaminants thus introduced, which comprises at least one of, in any order and depending on the contaminants incorporated, drying said contaminated gas to reduce contaminant water concentration in said contaminated gas to not greater than 10 ppm; contacting said contaminated gas with a carbon dioxide absorbent to reduce carbon dioxide concentration in said contaminated gas to not greater than 10 ppm; contacting said contaminated gas with an oxygen absorbent to reduce oxygen concentration in said contaminated gas to not greater than 1 ppm; and contacting said contaminated gas with a nitrogen getter to reduce nitrogen concentration in said contaminated gas to not greater than 1 ppm; and collecting said gas after such decontamination for recycle to said medical process and subsequent reuse therein. Most commonly the gas comprises an isotope of helium, xenon, carbon, fluorine or phosphorus.

In a more specific embodiment, the invention herein is of such a method wherein said gas is hyperpolarized prior to use in said medical process, and the medical procedure in which hyperpolarized gas is used comprises medical imaging, commonly magnetic resonance imaging (MRI).

BRIEF DESCRIPTION OF THE DRAWINGS

The single FIGURE of the drawings is a flow diagram illustrating the method of the present invention.

DETAILED DESCRIPTION AND PREFERRED EMBODIMENTS

The invention will be best understood by reference to the single FIGURE of the drawings, which illustrates in schematic form the movement of the gas (exemplified by $He^3$ for MRI) through the system 10. When the system is in operation much of the gas will be maintained under pressure in storage tank 20. From storage tank 20 the gas under pressure will pass through line 22 and valve 24 to and on through line 26, valve 27 and pressure regulator 28 to preliminary purification unit 30. In purification unit 30 the gas will be cleaned to remove any contaminants and particulate matter which may have become entrained in the gas from the interior walls of the tank 20 or the various lines and the valves through which the gas passes. A makeup supply of fresh gas can if needed be supplied through line 32, valve 34 and line 36 into line 26 from a conventional gas source (not shown); alternate locations for gas makeup can also be used, such as that shown at lines 31 and 35 and valve 33. Overpressure in line 26 can be relieved through line 38, pressure relief valve 40 and line 42. Because the gas in line 26 is of course the gas whose loss is to be minimized by the system 10, pressure relief valve 40 and line 42 will normally lead to a collection tank (not shown) from which the gas can be returned as through line 32.

After cleaning in unit 30, the gas will be passed through line 41 through oxygen removal unit 43 (commonly utilizing a nickel catalyst) to remove any oxygen which may have entered the gas during storage in tank 20 or with any makeup gas, since paramagnetic oxygen is harmful to the hyperpolarization unit 50 and reduces the MRI signal. From unit 43 the gas passes through line 44 to sterile filter 45 (biofilter) to remove any biological materials, such as pathogens, which could harm the patient. Typically this will be a stainless steel biofilter having a filtration capability in the range of 0.001–0.010 pm (1–10 nm), preferable about 0.003 $\mu$m (3 nm) filtration capability. It is preferred that biofilter 43 be one approved by the Food and Drug Administration. Alternatively, or preferable in addition, there may be an equivalent biofilter 99 in line 100 to remove any biological material in the gas after use in the medical procedure and before storage in tank 20, to the extent that any such material remains after passage through the rest of the system 10. The cleaned, filtered and deoxygenated image enhancing gas is then passed through line 47, valve 46 and line 48 to hyperpolarization unit 50, in which the gas is hyperpolarized in a conventional manner, normally by being exposed to a high energy laser beam; see the Beardsley article above.

The nature of the hyperpolarization process in unit 50 is not an element of the present invention, which is concerned with the provision of the pure gas to the hyperpolarization unit 50 and recovery and purification of the hyperpolarized gas after its use in the medical imaging procedure at 52. To the extent that different types of hyperpolarization procedures might be applicable for different image enhancing gases, they are all intended to be encompassed within the scope of this invention, since the current process for recovering purified into recycling image enhancing gases will be useful with all types of hyperpolarization processes for different types of medical imaging procedures. It is also contemplated that the hyperpolarization unit 50 need not be actually part of the system 10, but may be in a separate room, building, facility, etc., as shown at 50'. In such case the gas is passed through valve 63 and deposited into a gas-tight container 60 for transport to the location of unit 50'. It is there hyperpolarized, placed in a container 61 and returned to the system 10 through valve 65 into line 64. Further, it is contemplated that this system 10 may be used for gases which are not hyperpolarized. In such case unit 50 would not be present and the gas exiting valve 46 would pass through line segments 48, 49 and 64 to continue movement through the system.

In order to place the present invention in a normal operational context, the FIGURE includes a brief section showing (in alternate location lines) a typical use of the hyperpolarized gas in a medical imaging procedure, exemplified here by a magnetic resonance (MR) lung scan procedure using $He^3$ being conducted in a MRI unit 52. The hyperpolarized gas is vented from unit 50 through line 53 to a collection container 56 which is commonly a small gas tight bag, such as a bag made of Tedlar™ fabric. The closed bag 56 filled with the image enhancing gas is then transported to MRI unit 52 where the patient inhales the gas from the bag, holds his or her breath while the lungs are imaged with an MRI scan, and then exhales into a second similar bag 57. Normally the patient will exhale into bag 57 several times to clear as much of the $He^3$ from his or her lungs as possible. (Bag 57 will normally be larger than bag 53 to contain the larger volume of the patient's exhalations.) The $He^3$ concentration in bag 57 may be as low as 1%–2% and still be capable of advantageous recovery in the system 10. After the last exhalation by the patient, the bag 57 is passed back to the purification and collection system 10 of the present invention through line 62. Also returned through line 62 is the uninhaled portion of gas in bag 56, which itself usually now contains some environmental contaminants from having been opened for the patient's inhalation, as well as any contaminants that the patient may have injected by any exhalation into the bag 56 before inhaling the gas for the MRI procedure. (It is understood that during other types of MRI procedures, such as MR brain scans with $Xe^{129}$, the patient will just inhale and exhale the gas to fill his or her lungs, from which the gas will eventually pass into the blood stream and then on to the brain. After the inhalations and exhalations have been completed, the bags 56 and 57 are returned to current purification and collection system as described above. The actual MRI scan will be done some time later, when the imaging gas has dispersed into the brain.)

The contaminated gases in bags 56 and 57 are discharged back into the system 10 through line 62 and into line 64. Line 64 is also used to discharge unused purified gas from unit 50 after bag 56 has been filled through line 54, so that no gas is lost from the system. Hyperpolarization units such as 50 have incorporated valves (not shown) which permit intake of gas from line 48, outlet of gas into line 64, and outflow of gas in line 53, as appropriate.

Line 64 contains the gas under subatmospheric pressure (vacuum) because of the operation of vacuum pump 66 to which line 64 is connected through orifice plate 67, line 68, valve 70 and surge tank 72. Vacuum pump 66 discharges through pressure valve 74 and line 76 to dryer 78. In dryer 78 water and some carbon dioxide are removed, preferably down to a water concentration of no more than 10 ppm, preferably no more than 100 ppb, and more preferably no more than 10 ppb. Gas drying is well known and many suitable dryers are available commercially. A particularly preferred one is that described and claimed in allowed U.S. patent application Ser. No. 08/933,668, filed on Sep. 19, 1997, which removes water from non-corrosive gas streams by using an oxide or salt of an electropositive metal, such as a high surface area titania, zirconia, yttria or vanadia. Carbon dioxide removal will also be as thorough as possible in dryer 78, but other decontamination units in the process will serve to remove further carbon dioxide to reach the same type of carbon dioxide concentration limits as with the water vapor, i.e. to concentration limits no more that 1 ppm, preferably no more than 100 ppb, and more preferably no more than 10 ppb.

From dryer 78 the dried gas passes through line 80, valve 82 and line 83 to one or more optional purification units at 84. Units at 84 are intended to reduce the concentration in the gas of such non-noble gases as hydrogen, hydrocarbons, nitrogen oxides and ozone that may be present in the patient's exhalation. Reduction is normally down to about 10 ppm. There are various commercial devices which can be used at 84 depending on the specific nonnoble gases of interest. From the units at 84 the gas passes through line 85 to oxygen removal unit 88. Unit 88 is configured to catalytically remove oxygen from the gas stream, normally down to a maximum concentration limit an order of magnitude less that those described above for water vapor and carbon dioxide; i.e., down to concentration limits no more that 1 ppm, preferably no more than 10 ppb, and more preferably no more than 1 ppb. These low limits are due to oxygen being a paramagnetic gas, which as noted is harmful to hyperpolarization units and reduces an MRI signal. Some carbon dioxide (which also has paramagnetic properties) may also be removed in this unit, as may some of the small amount of air pollutant gases in the patient's exhalant, such as carbon monoxide, nitrogen oxides and ozone.

Both dryer 78 and unit 88 can be taken out of the system for regeneration, as by autoventing. "Out of the system" may mean physical removal, as during a system shutdown (and perhaps replacement by another equivalent unit), or by being isolated from the system by bypass lines (not shown) and regenerated in situ. Similarly, some or all of the units at 84 may be regenerable.

The gas stream, now purified of oxygen, carbon dioxide and similar gases as well as water vapor, then is discharged from unit 88 through line 86, check valve 90 and line 92 to getter 94. Getter 94 is typically a heated titanium sponge or similar catalytic metal or metal alloy designed to remove as much nitrogen as possible from the gas stream. (Some nitrogen oxides and hydrogen may also be removed in this unit.) The specific amount of nitrogen to be removed is not critical, since nitrogen is inert in the hyperpolarization process. However, because nitrogen represents the largest contaminant by volume (since it is 80% of the air in a person's lungs), failure to operate getter 94 to remove the nitrogen down to relatively low levels of concentration means that the excess nitrogen will have to be compressed and stored in tank 20 and it will be present as a diluent in the gas passing to hyperpolarization unit 50. In each of these cases the excessive nitrogen means that the compressor 96, the storage tank 20 and the hyperpolarization unit 50 must all be designed with higher capacity at added cost. Thus the degree of nitrogen removal which is appropriate in any system will be such that the nitrogen is reduced to a concentration at which its added economic cost as a diluent is offset by the added economic cost of building excess capacity into the compressor, storage tank and hyperpolarization unit to accommodate the extra nitrogen.

Getter 94 operates at high temperature, normally on the order of 350° C. (660° F.), and higher temperature excursions will be harmful to the catalyst. The primary cause of such excursions in the present system will be an oversupply of oxygen to the getter 94. Orifice 67 is incorporated into the system to control the gas flow rate, and to reduce the flow rate if the temperature in getter 94 begins to rise toward an unacceptable level.

The gas stream exiting from getter 94 will now be composed almost entirely of the recovered image enhancing gas plus that residual amount of contaminants (e.g., argon) which it is uneconomical to remove and which will not poison the hyperpolarization system. This gas stream exits through line 98 to compressor 96 in which the gas stream is compressed to superatmospheric pressure and returned through line 100 to line 26 and then back through valve 24 and line 22 to tank 20. Valve 28 is closed as is valve 34 so that the returned gas will be directed into tank 20. If desired, fresh makeup gas entering through line 32, valve 34 and line 36 (or line 31, valve 33 and line 35) may also be added into line 26 or 98 at this time and directed back into line tank 20 for mixing with the recycled gas from line 100 to produce up a sufficient stock of image enhancing gas to run a desired number of medical imaging procedures before having to add additional makeup gas between procedures.

An alternative position for compressor 96 is shown at 96'. With the compressor 96' in this position, all of the purification units 78, 88 and 94 will operate undersuperatmospheric pressure instead of undervacuum as described in the embodiment above, and must be designed accordingly as pressure vessels. Location 96' is anticipated to be a less preferred location for the compressor than location 96, since it means that compressor 96' must act on the entire volume of the gas stream before any decontamination and removal of contaminant gases has occurred, as compared to compressor 96 which only compresses the purified image enhancing gas volume. However, this may be of minimal concern, since the volumes of gas passing through the system are relatively small, given that the normal volume of gas inhaled and exhaled by a person is only on the order of 3–4 liters, of which about 25% will be $He^3$. Since commonly a maximum of only about 2–3 medical imaging procedures are conducted per hour for an imaging unit, this means that the gas flow rate through the system is only approximately 10 liters per hour, with about 2–3 L/hr of $He^3$ to be recovered. Thus the operator will consider the difference in capacity between compressors 96 and 96' as well as the relative sizes and costs of units 78, 88 and 94 as pressurized or non-pressurized vessel, to determine what size of compressor will be appropriate and whether it should be at 96 or 96', or even at some other location in the system between the vacuum pump 66 and the return line 100.

As has been noted above, it is preferred that all equipment in the system, including piping, valves, pumps and compressors, be non-contaminating or at least food-contact grade. By this is meant that they should not require for their operation the presence of any contaminating material which can come into contact with the feed gas or gas/exhalant stream. Most commonly, this "contaminating material" will be a lubricant, sealant or other material which contains a volatile component, the most common of which is one or more of the hydrocarbon compounds. All hydrocarbon oils and greases are volatile to a greater or lesser degree, and each has a significant partial pressure when used under the operating conditions typical of gas compressors and vacuum pumps. Consequently, it is preferred in the present process that the equipment be such that no lubricant or other solid, liquid or gaseous contaminating material be used in the equipment in any capacity in which it can contact the gas stream. There are a number of suitable vacuum pumps and compressors commercially available on the market, including those known as diaphragm compressors, dry vacuum pumps and oil-free compressors; many suitable ones are made by companies such as Air Dimensions, Inc.; Galiso/Nuvac, Inc.; Danielson Associates; Varian; Haskel, Inc.; Senior Flexonics, Inc. and Thomas Industries.

Suitable purifiers, scrubbers, getters and the like are described in the commercial literature. In addition, there are numerous patents which describe all of the devices or important features thereof. Many suitable decontamination units for various gaseous contaminants are available commercially from the assignee of the present application, Aeronex, Inc., of San Diego, Calif.

The various decontamination units, pumps, compressors, valves and lines in the system will be fabricated from materials which are selected with regard to the properties of the image enhancing gas (and its anticipated contaminants being transported. As above, such properties as corrosiveness and leak potential will be important in the selection of the valve and conduit materials. Typically, the conduits and valves will be formed of stainless steel (such as Type 316L) or another resistant alloy and will be all-welded; the fittings will commonly be high integrity compression or face seal fittings. Leak potential will be particularly significant when $He^3$ is the image enhancing gas. It is well known that helium is uniquely difficult to restrain within a system, and some leakage of $He^3$ is to be expected. However, in view of the rarity of $He^3$ and its non-recoverable loss once having leaked from the system, system leakage potential should be kept to the minimum practical.

The pressure ranges in the various parts of the system are not critical but will be such that the vacuum or elevated pressure levels selected will be highly efficient in providing the feed gas to the hyperpolarization unit 50 and in moving the exhalant-contaminated gas through the decontamination steps either under vacuum or pressure. Typical of the usable ranges are superatmospheric pressure up to about 250 psig (1725 kPag] through subatmospheric down to about 100 mTorr (0.01 kPag).

The image enhancing gases to which this system will be applicable are those such as $He^3$ and $Xe^{129}$ which are either rare or expensive or both. For some imaging procedures it may be that the image enhancing gases used are neither rare nor expensive, such as common isotopes of major atmospheric gases. For such gases, simply venting from a unit 50 and emptying of bag 56 to the atmosphere after the imaging procedures have been completed is perfectly acceptable. Such gases are of no environmental hazard and can be readily recovered from atmospheric air by common and inexpensive air separation procedures. While such gases could of course be recovered by the present process, is unlikely to be economically justifiable to do so. On the other hand, the present process is not to be considered to be limited only to $He^3$ and $Xe^{129}$, but rather will be applicable for use with substantially all image and handling enhancing gaseous isotopes which may be identified in the future and for which application of this process for recovery and purification can be justified economically.

It will also be seen that the present invention is well suited to being automated to any degree desired. A computer 102 and the appropriate software may be used to control the opening and closing of various valves such as 24, 46 and 70, operation of the compressor 96/96' and pump 66, the various decontamination units 72, 78, 88 and 94, and the hyperpolarization unit 50, all as graphically indicated by the dotted lines 104 in the FIGURE. Other equivalent connections not shown can operate other valves in the system as well as making determinations such as the quantity of gas present in tank 20. Thus, for instance, discharge of contaminated gas from bag 57 into line 64 can be recognized by a pressure sensor 106 in line 64, which sends a signal through line 108 to computer 102. Suitable software will then start a sequence in which the various valves, pump, compressor and decontamination units are opened and closed in the proper sequence and started and stopped at appropriate intervals, so that decontamination of the image enhancing gas can be accomplished and the purified gas can be collected in tank 20 for reuse. Overheating in getter 94 likewise can be detected by temperature sensor 93, which also signals through line 108 to microprocessor 102, which responds by control of orifice 97. Such control and operating functions are all well within the knowledge of those skilled in the art and the capabilities of commercially available computer systems and software. The operator of the present system can therefore select systems and software to automate as much or as little as desired of the system.

It will be evident that there are numerous embodiments of the present invention which, while not expressly described above, are clearly within the scope and spirit of the present invention. The above description is therefore to be considered exemplary only, and the scope of the invention is to be determined solely by the appended claims.

We claim:

1. A method for recovery and purification of a gas used to enhance a medical process, which comprises:
    a. passing said gas to said medical process and therein using said gas for enhancement of said process, use in said process also causing gaseous or liquid contaminants including water vapor, carbon dioxide, oxygen or nitrogen, to become incorporated into said gas;
    b. collecting at least a portion of thus-contaminated gas;
    c. determining which said gaseous or liquid contaminants are contained in said gas;
    d. drying said contaminated gas to reduce said water concentration in said contaminated gas to not greater than 10 ppm, if said contaminated gas contains a water concentration;
    e. contacting said contaminated gas with a carbon dioxide absorbent to reduce said carbon dioxide concentration to not greater than 10 ppm, if said contaminated gas contains a carbon dioxide concentration;
    f. contacting said contaminated gas with an oxygen absorbent to reduce said oxygen concentration to not greater than 1 ppm, if said contaminated gas contains an oxygen concentration;
    g. contacting said contaminated gas with a nitrogen getter to reduce said nitrogen concentration to not greater than 1 ppm, if said contaminated gas contains a nitrogen concentration;
    h. reducing other non-noble gaseous contaminants to not greater than 10 ppm, if said contaminated gas contains said other non-noble gaseous contaminants; and
    i. collecting said gas after such decontamination for recycle to said medical process and subsequent reuse therein.

2. A method as in claim 1 wherein said gas is selected from a group consisting of an isotope of helium, xenon, carbon, fluorine and phosphorous.

3. A method as in claim 2 wherein said isotope of helium comprises $He^3$.

4. A method as in claim 2 wherein said isotope of xenon comprises $Xe^{129}$.

5. A method as in claim 2 wherein said isotope of carbon comprises $C^{13}$.

6. A method as in claim 2 wherein said isotope of fluorine comprises $F^{19}$.

7. A method as in claim 2 wherein said isotope of phosphorus comprises $P^{31}$.

8. A method as in claim 1 where said contaminant water concentration in said contaminated gas is reduced to not greater than 100 ppb.

9. A method as in claim 8 where said contaminant water concentration in said contaminated gas is reduced to not greater than 10 ppb.

10. A method as in claim 1 where said carbon dioxide concentration in said contaminated gas is reduced to not greater than 100 ppb.

11. A method as in claim 10 where said contaminant water concentration in said contaminated gas is reduced to not greater than 10 ppb.

12. A method as in claim 1 where said oxygen concentration in said contaminated gas is reduced to not greater than 100 ppb.

13. A method as in claim 12 where said oxygen concentration in said contaminated gas is reduced to not greater than 10 ppb.

14. A method as in claim 1 wherein said other non-noble gaseous contaminants are selected from a group consisting of hydrogen, a hydrocarbon, a nitrogen oxide and ozone.

15. A method as in claim 1 further comprising hyperpolarizing said gas prior to passage of said gas to said medical process.

16. A method as in claim 15 wherein said gas prior to said hyperpolarization is under superatmospheric pressure.

17. A method as in claim 16 wherein said medical procedure in which hyperpolarized gas is used comprises medical imaging.

18. A method as in claim 17 wherein said medical imaging procedure in which hyperpolarized gas is used comprises magnetic resonance imaging.

19. A method as in claim 18 wherein said gas is selected from the group consisting of helium and xenon isotopes.

20. A method as in claim 19 wherein said isotope of helium comprises $He^3$.

21. A method as in claim 19 wherein said isotope of xenon comprises $Xe^{129}$.

22. A method as in claim 15 wherein following hyperpolarization said gas is collected in a first gas-tight container from which said gas is inhaled by said patient during said medical imaging process, and following medical imaging of said patient said gas is subsequently exhaled by said patient into second gas-tight container, said gas exhaled being contaminated with respiratory gases and vapors simultaneously exhaled by said patient, following which said contaminated gas in said second container is withdrawn from said second container under subatnospheric pressure and passed for decontamination in steps d–h.

23. A method as in claim 22 further comprising, prior to said decontamination, compressing thus-decontaminated gas and purifying and storing said decontaminated gas under superatmospheric pressure for said recycle and reuse.

24. A method as in claim 22 further comprising, following said decontamination, compressing thus-decontaminated gas and storing said decontaminated gas under superatmospheric pressure for said recycle and reuse.

25. A method as in claim 22 wherein residual gas in said first container not inhaled by said patient is withdrawn from said first container under substmospheric pressure and also passed for decontamination in steps d–h.

26. A method as in claim 25 further comprising, prior to said decontamination, compressing thus-decontaminated gas and purifying and storing said decontaminated gas under superatmospheric pressure for said recycle and reuse.

27. A method as in claim 25 further comprising, following said decontamination, compressing thus-decontaminated gas and storing said decontaminated gas under superatmospheric pressure for said recycle and reuse.

28. A method as in claim 1 wherein said gas passed in step a. to said medical process comprises a mixture of a first quantity of said decontaminated gas which has been used at least once in a prior such medical process and a second quantity of fresh said gas which has not previously been used in said medical process.

29. A method as in claim 15 wherein said hyperpolarized gas passed in step a. to said medical imaging comprises a mixture of a first quantity of said decontaminated gas which has been used at least once in prior such medical imaging and a second quantity of fresh said gas which has not previously been used in said medical imaging.

30. A method as in claim 1 wherein at least one of the steps therein is controlled by a microprocessor.

31. A method as in claim 15 wherein at least one of the steps therein is controlled by a microprocessor.

32. A method as in claim 1 further comprising filtering said contaminated gas through a filter to extract biological materials from said gas.

33. A method as in claim 32 wherein said filter has a biological filtration capability in the range of 1–10 nm.

34. A method as in claim 33 wherein said filter has a biological filtration capability on the order of 3 nm.

35. A method as in claim 1 wherein following decontamination of said gas in steps d–h, a process unit in which said decontamination has been conducted is isolated and regenerated for future decontamination, and thereafter said isolation of said unit is terminated and said unit as regenerated is made available for use in said method.

36. A method as in claim 35 wherein said isolation is by removal of said unit from incorporation in a decontamination process which performs said method, followed after regeneration by return to availability by reincorporation into said process.

37. A method as in claim 35 wherein said isolation is by bypassing of said unit in a decontamination process which performs said method, followed after regeneration by return to availability by such bypassing being terminated.

38. A method as in claim 35 wherein said process unit conducts said drying of step d.

39. A method as in claim 35 wherein said process unit conducts said contacting with a carbon dioxide absorbent of step e.

40. A method as in claim 35 wherein said process unit conducts said contacting with an oxygen absorbent of step f.

41. A method as in claim 35 wherein said process unit conducts said contacting with a nitrogen getter of step g.

42. A method as in claim 35 wherein said process unit conducts said reducing of step h.

* * * * *